(12) United States Patent
Derner et al.

(10) Patent No.: US 11,450,740 B2
(45) Date of Patent: Sep. 20, 2022

(54) INTEGRATED MEMORY COMPRISING GATED REGIONS BETWEEN CHARGE-STORAGE DEVICES AND ACCESS DEVICES

(71) Applicant: Micron Technology, Inc., Boise, ID (US)

(72) Inventors: Scott J. Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 178 days.

(21) Appl. No.: 16/514,827

(22) Filed: Jul. 17, 2019

(65) Prior Publication Data
US 2020/0052070 A1  Feb. 13, 2020

Related U.S. Application Data

(60) Provisional application No. 62/717,629, filed on Aug. 10, 2018.

(51) Int. Cl.
| | | |
|---|---|---|
| *H01L 29/08* | (2006.01) | |
| *H01L 29/423* | (2006.01) | |
| *H01L 29/78* | (2006.01) | |
| *G11C 11/407* | (2006.01) | |
| *H01L 29/06* | (2006.01) | |
| *H01L 29/40* | (2006.01) | |
| *H01L 27/108* | (2006.01) | |
| *G11C 5/02* | (2006.01) | |

(52) U.S. Cl.
CPC .......... *H01L 29/0847* (2013.01); *G11C 5/025* (2013.01); *G11C 11/407* (2013.01); *H01L 27/10814* (2013.01); *H01L 27/10855* (2013.01); *H01L 29/0653* (2013.01); *H01L 29/402* (2013.01); *H01L 29/4238* (2013.01); *H01L 29/7835* (2013.01)

(58) Field of Classification Search
None
See application file for complete search history.

(56) References Cited

U.S. PATENT DOCUMENTS

| | | | | |
|---|---|---|---|---|
| 2002/0014649 A1* | 2/2002 | Kunikiyo | .......... | H01L 27/10855 257/306 |
| 2010/0066312 A1* | 3/2010 | Lu | ........................ | H02J 7/00308 320/162 |
| 2016/0055049 A1* | 2/2016 | Lukashevich | ....... | G06F 11/0757 714/55 |

* cited by examiner

*Primary Examiner* — Shaun M Campbell
*Assistant Examiner* — Aneta B Cieslewicz
(74) *Attorney, Agent, or Firm* — Wells St. John P.S.

(57) ABSTRACT

Some embodiments include an integrated assembly having an access transistor. The access transistor has a first source/drain region gatedly coupled with a second source/drain region. A digit line is coupled with the first source/drain region. A charge-storage device is coupled with the second source/drain region through an interconnect. The interconnect includes a length of a semiconductor material. A protective transistor gates a portion of the length of the semiconductor material.

27 Claims, 10 Drawing Sheets

INTEGRATED MEMORY COMPRISING GATED REGIONS BETWEEN CHARGE-STORAGE DEVICES AND ACCESS DEVICES

RELATED PATENT DATE

This patent is related to U.S. Provisional Application Ser. No. 62/717,629 which was filed Aug. 10, 2018.

TECHNICAL FIELD

Integrated memory comprising gated regions between charge-storage devices and access devices.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which each have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and has another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with the memory cell 2a comprising a transistor T1 and a capacitor C1, and with memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("Array 1" and "Array 2"), with each of arrays including memory cells of the type described in FIG. 2 (not labeled in FIG. 3 in order to simplify the drawing). Wordlines WL0-WL7 extend across the arrays, and are coupled with wordline drivers. Digit lines D0-D8 are associated with the first array (Array 1), and digit lines D0*-D8* are associated with the second array (Array 2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0), In a read operation, one of the paired digit lines may serve as a reference in determining electrical properties (e.g., voltage) of the other of the paired digit lines.

A problem which may be encountered with conventional DRAM is that operation along a row of memory cells may problematically disturb an adjacent row of memory cells, and may eventually result in data loss from one or of the memory cells along the adjacent row. It would be desirable to develop arrangements which avoid such data loss.

DETAILED DESCRIPTION OF THE ILLUSTRATED EMBODIMENTS

Some embodiments include integrated assemblies having memory cells which each include an access transistor associated with a charge-storage device (e.g., a capacitor). Each memory cell also includes a protective transistor (or other suitable switch) to control current flow between the charge-storage device and a source/drain region of the associated transistor, which may alleviate or prevent the problematic data loss discussed above in the Background section. Example embodiments are described with reference to FIGS. 4-11.

Figure 2:
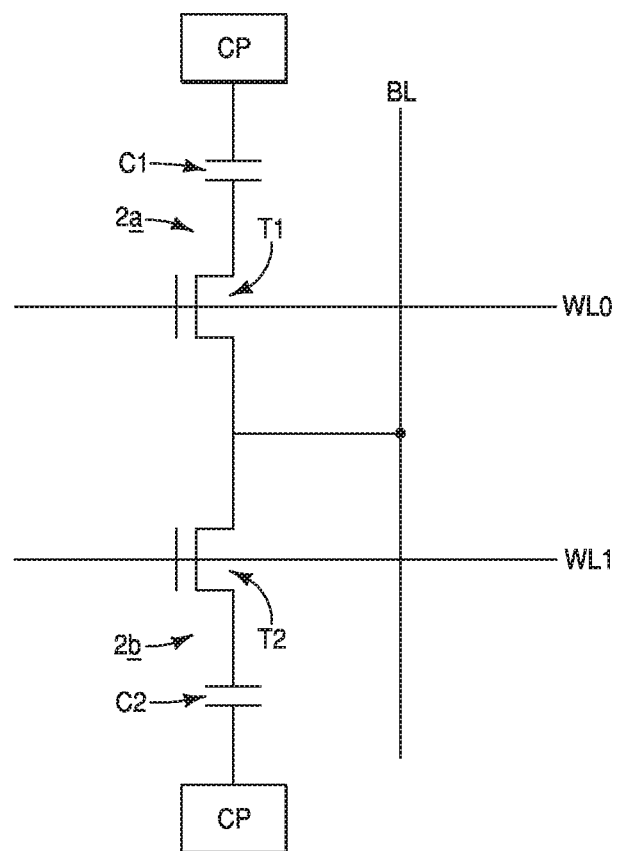
FIG. 2 is a schematic diagram of a pair of prior art memory cells which each have 1 transistor and 1 capacitor, and which share a bitline connection.
Figure 3:
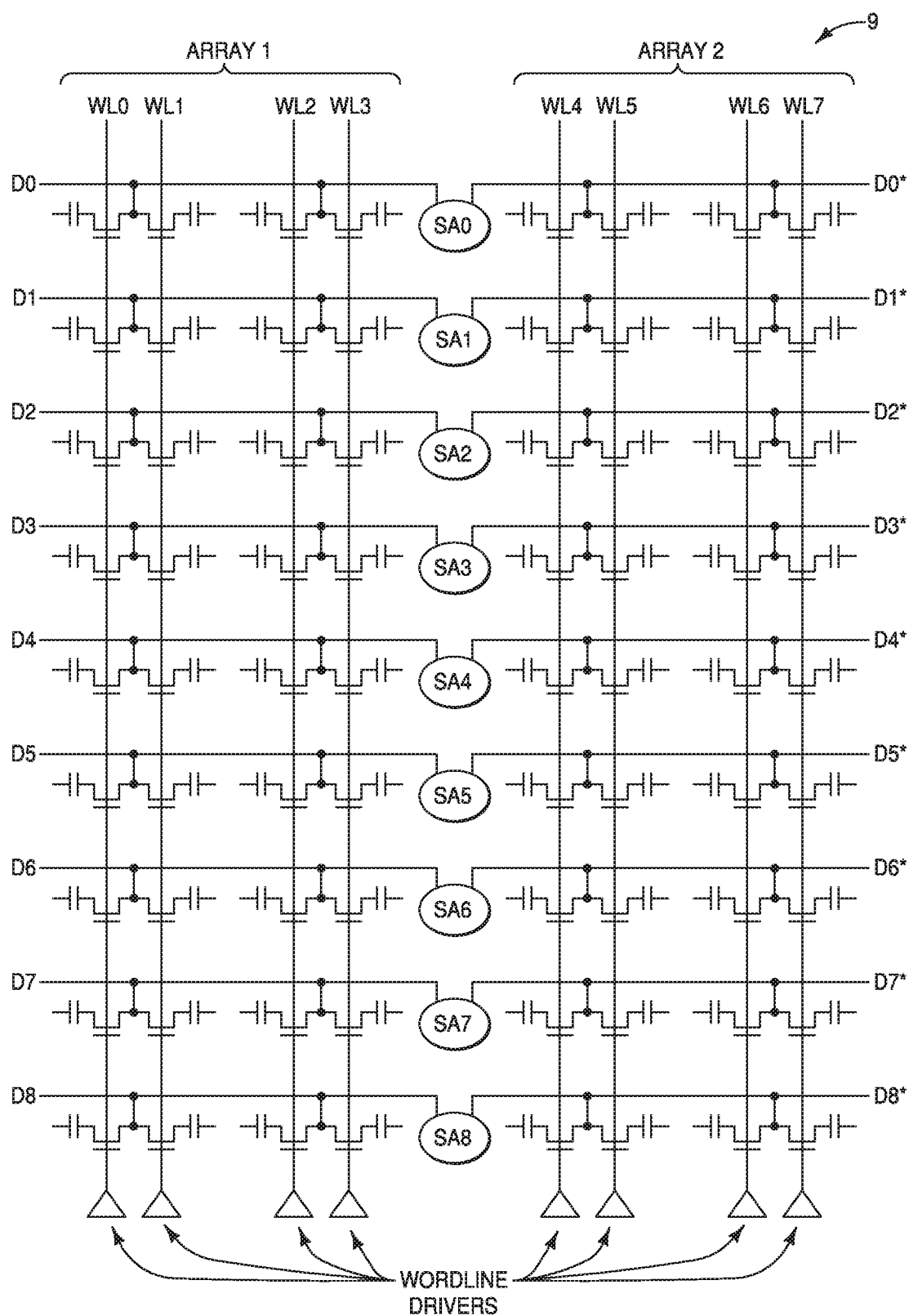
FIG. 3 is a schematic diagram of a prior art integrated assembly having open bitline architecture.
Figure 4:
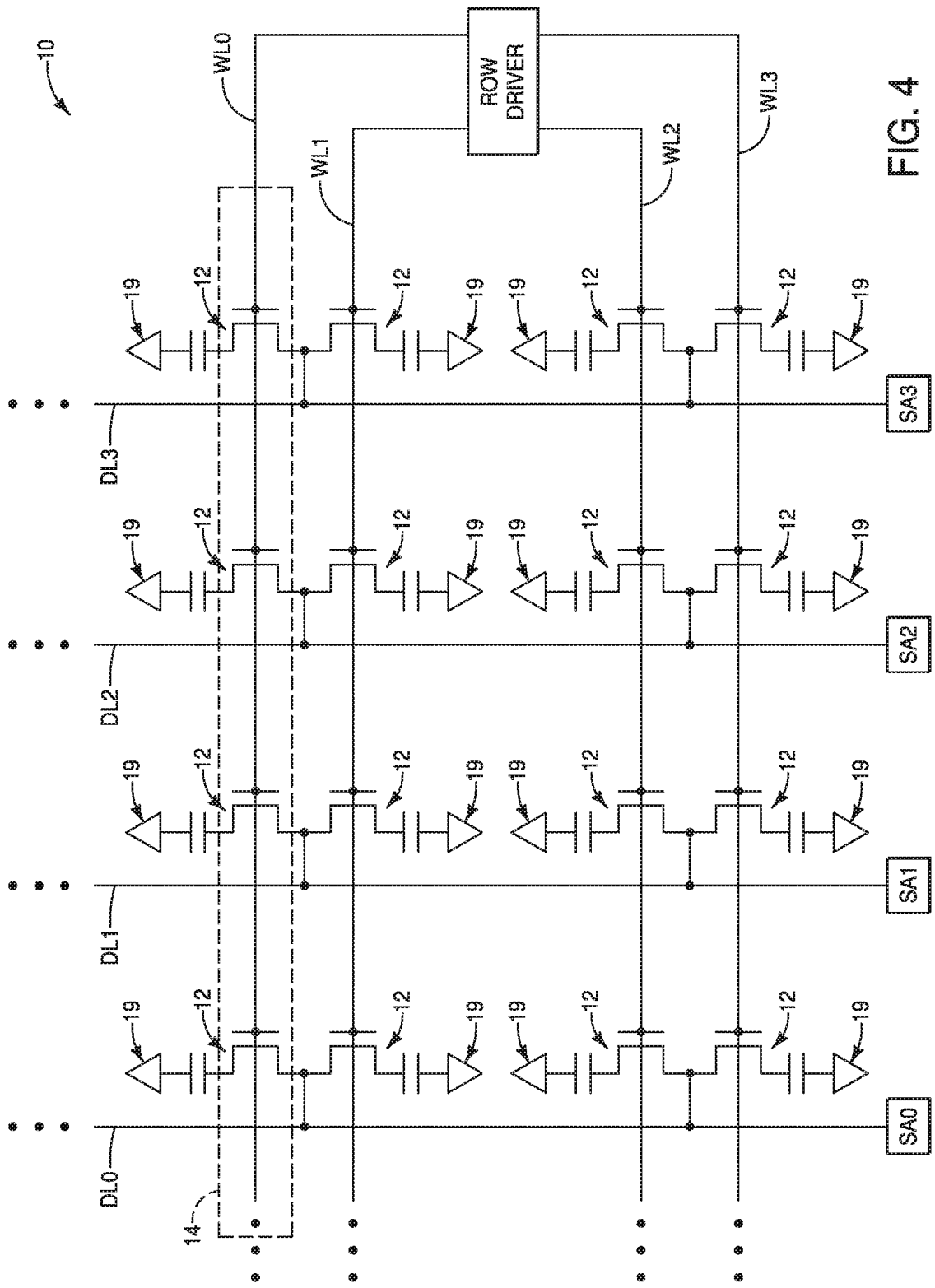
FIG. 4 is a schematic diagram of an example memory array illustrating an example inter-cell disturb problem.

Referring to FIG. 4, a region of a memory array 10 is shown to comprise a plurality of digit lines (DL0, DL1, DL1 and DL3), a plurality of wordlines (WL0, WL1, WL2 and WL3). Memory cells 12 are addressed by the wordlines and digit lines. Each of the memory cells comprises a transistor and a capacitor, and is analogous to the memory cells 2a and 2b described above with reference to FIG. 2. The digit lines extend to sense amplifiers (SA0, SA1, SA2 and SA3), and the wordlines extend to a Row Driver. In some embodiments, the memory array 10 be considered to correspond to one of the arrays described above with reference to FIG. 3 (i.e., Array-1 or Array-2).

Figure 1:
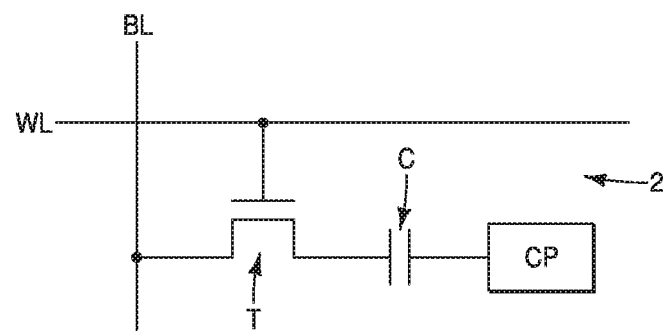
FIG. 1 is a schematic diagram of a prior art memory cell having 1 transistor and 1 capacitor.

The capacitors have nodes connected to reference structures 19. The reference structures may comprise any suitable voltage; and in some embodiments may correspond to common plates of the type described above with reference to FIGS. 1 and 2.

A box 14 is provided around the row addressed by the wordline WL0 to indicate that such wordline is activated. The activation of the wordline WL0 accesses the memory cells 12 along such wordline for various operations (e.g., read/write operations, refresh operations, etc.). Often, some rows of a memory array will be activated much more frequently than others. The rows which are frequently activated may be referred to as being "hammered" in that they experience an exceptional amount of usage. As discussed above in the Background section, a problem which may occur is that operation (i.e., activation) of one row of memory cells may problematically disturb an adjacent row of memory cells. Such problem may be particularly likely to manifest adjacent rows which are "hammered".

Figure 5:
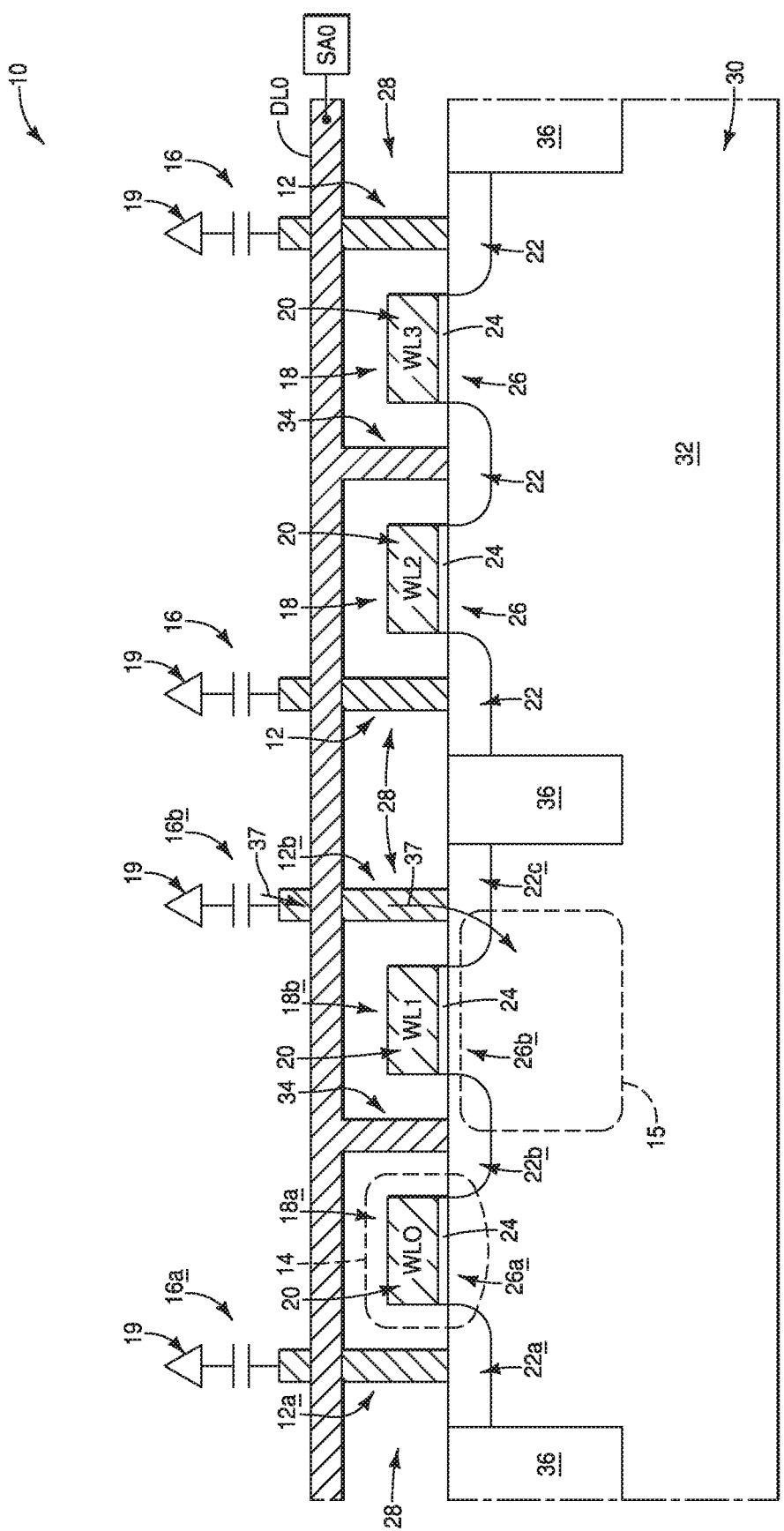
FIG. 5 is a diagrammatic cross-sectional side view showing a region of an example integrated assembly which may be within the memory array of FIG. 4.

FIG. 5 shows a cross-section along a region of the memory array 10 of FIG. 4, and shows each of the memory cells 12 comprising a capacitor 16 and a transistor 18. The capacitors 16 may be considered to be examples of charge-storage devices which may be utilized in the memory cells 12. In other embodiments, other suitable charge-storage devices may be utilized; with examples of other suitable charge-storage devices including phase change materials, conductive-bridging materials, etc.

The transistors and capacitors are supported by a base 30 comprising semiconductor material 32. The semiconductor material 32 may comprise any suitable composition(s); and in some embodiments may comprise, consist essentially of, or consist of one or more of silicon, germanium, MN semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). For instance, the semiconductor material 32 may comprise, consist essentially of, or consist of monocrystalline silicon.

The base 30 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 30 may correspond to a semiconductor substrate containing one or more materials associated with integrated circuit fabrication. Such materials may include, for example, one or more of refractory metal materials, barrier materials, diffusion materials, insulator materials, etc.

The illustrated transistors have gates 20 along the wordlines WL0-WL3, and have source/drain regions 22 extending into the semiconductor material 32 of the base 30. The source/drain regions may comprise conductively-doped regions within the semiconductor material 32.

The gates 20 are spaced from the semiconductor material 32 by dielectric material (i.e., insulative material) 24. The dielectric material 24 may comprise any suitable composition(s); and in some embodiments may comprise, consist essentially of, or consist of silicon dioxide. The dielectric material 24 may be referred to as gate dielectric material.

The transistors 18 have channel regions 26 beneath the gates 20; and the source/drain regions of each of the transistors are gatedly coupled to one another through the channel region between them. In the illustrated embodiment, the channel regions 26 extend horizontally between the source/drain regions 22.

The capacitors 16 are coupled with vertically-extending interconnects 28, which in turn are coupled with some of the source/drain regions 22. Others of the source/drain regions 22 are coupled with the digit line DL0 through vertically-extending interconnects 34. The interconnects 28 and 34 may comprise any suitable electrically conductive composition(s).

The transistors 18 are in paired relationships such that two adjacent transistors share a common connection to the digit line. For instance, two of the transistors are labeled as 18a and 18b, and such transistors are paired with one another. The transistors 18a, and 18b may be referred to as first and second transistors, respectively. The transistors 18a and 18b together comprise three source/drain regions (labeled 22a, 22b and 22c). The source/drain regions 22a, 22b and 22c may be referred to as first, second and third source/drain regions respectively. The second source; drain region 22b is shared between the first and second transistors 18a and 18b, and is coupled with the digit line DL0. The first source/drain region is coupled with a first capacitor (labeled 16a), and the third source/drain region is coupled with a second capacitor (labeled 16b).

The channel regions of the first and second transistors 18a and 18b are labeled 26a and 26b, and may be referred to as first and second channel regions, respectively.

The memory cells comprising the first and second transistors 18a and 18b are labeled as memory cells 12a and 12b, and may be referred to as first and second memory, cells, respectively.

Isolation material 36 extends into the base 30 and separates paired-transistor-arrangements from one another. The isolation material 36 may comprise any suitable composition(s); and in some embodiments may comprise, consist essentially of, or consist of silicon oxide.

The wordline WL0 is surrounded by the box 14 to indicate that such wordline is activated. Another box 15 is provided within the base 30 proximate the wordline WL1 to indicate that such region may be disrupted during the activation of the wordline WL0. The disruption within the region of box 15 may lead to junction leakage and/or to other mechanisms which enable discharge of current from the capacitor 16b into the base 30 (as is diagrammatically illustrated utilizing arrows 37), and thus may problematically lead to loss of data from the memory cell 12b.

Figure 6:
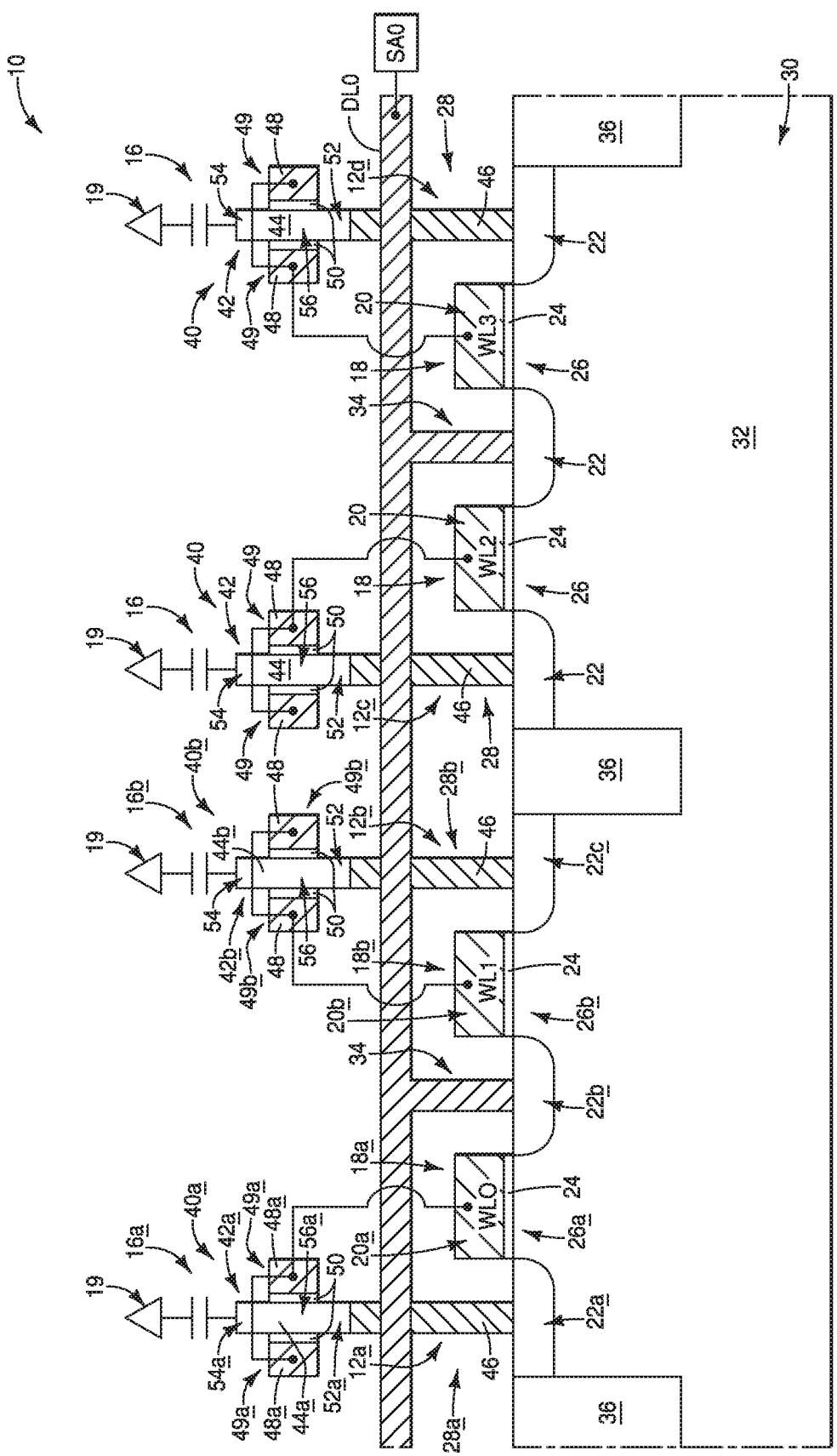
FIG. 6 is a diagrammatic cross-sectional side view showing a region of an example integrated assembly.

Some embodiments include provision of protective transistors between the capacitors 16 and the associated source/drain regions (e.g., along the interconnects 28) to alleviate the problematic discharge of current from the capacitors into the base while adjacent rows are "hammered". For instance, FIG. 6 shows a region of the memory array 10 modified to include protective transistors 40 between the capacitors 16 and the source/drain regions 22; and specifically along the interconnects 28. The protective transistors coupled with the source/drain regions 22a and 22c are labeled as transistors 40a and 40b, and may be referred to as first and second protective transistors, respectively.

In some embodiments, the transistors 18 may be referred to as access transistors in order to distinguish them from the protective transistors 40.

The interconnects 28 are shown to be extended to include pillars 42 of semiconductor material 44. The pillars 42 extend vertically, and may be referred to as vertically-extending lengths of the semiconductor material 44. In other embodiments, the lengths of semiconductor material 44 may extend in directions other than vertically.

In the shown embodiment, each of the interconnects 28 includes a first conductive material 46 under the semiconductor material 44. The first conductive material 46 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first material 46 may comprise a same composition as the semiconductor material 44, and may be a conductively-doped extension of the semiconductor material 44.

The semiconductor material 44 may comprise any suitable composition(s); and in some embodiments may comprise, consist essentially of, or consist of one or more of silicon, germanium, III/V semiconductor material (e.g., gallium phosphide), semiconductor oxide, etc.; with the term MN semiconductor material referring to semiconductor materials comprising elements selected from groups and V of the periodic table (with groups III and V being old nomenclature, and now being referred to as groups 13 and 15). In some example embodiments, the semiconductor material 44 may comprise polycrystalline silicon.

In some embodiments, the materials 44 and 46 may be considered together to form the interconnects 28 which extend between the source/drain regions 22 and the capacitors 16. In the shown embodiment, the interconnect associated with the capacitor 16a is labeled as an interconnect 28a, and the interconnect associate with the capacitor 16b is labeled as an interconnect 28b. The interconnects 28a and 28b may be referred to as first and second interconnects, respectively; and are coupled with the first and third source/drain regions 22a and 22c. The pillars (i.e., semiconductor-material lengths) 42a and 42b within the interconnects 28a and 28b may be referred to as first and second pillars (or as first and second semiconductor-material lengths), respectively; and the semiconductor materials 44a and 44b within such pillars may be referred to as first and second semiconductor materials, respectively.

The protective transistors 40 include conductive gating material 48, and include insulative material 50 between the gating material 48 and the semiconductor material 44 of the pillars 42.

The gating material 48 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The gating material 48 is configured as transistor gates 49.

The insulative material 50 may comprise any suitable composition(s); and in some embodiments may comprise, consist essentially of, or consist of silicon dioxide. The insulative material 50 may be referred to as gate dielectric material in some embodiments.

The protective transistors 40 comprise source/drain regions 52 and 54, and channel regions 56 between the source/drain regions. The source/drain regions 54 may be referred to as upper source/drain regions, and the source/drain regions 52 may be referred to as lower source/drain regions. The channel regions 56 extend vertically between the upper and lower source/drain regions. In some embodiments, the protective transistors 40 may be referred to as vertical transistors due to the vertically-extending channel regions 56; and the access transistors 18 may be referred to as planar transistors due to the horizontally-extending channel regions 26. In some embodiments, the access transistor 18a may be considered to have first and second source/drain regions 22a and 22b which are spaced from one another by a horizontally-extending channel region 26a; and the protective transistor 40a may be considered to comprise third and fourth source/drain regions 52a and 54a which are spaced from one another by a vertically-extending channel region 56a.

The channel regions 56 correspond to the gated portions of the pillars 42 (i.e., to gated portions of the lengths of semiconductor material 44). In some embodiments, the channel regions 56 may be referred to as gated portions of the interconnects 28.

In some embodiments, the protective transistors 40 may be considered to be examples of switches which control current flow along the interconnects 28. Such switches may have a "closed" operational state and an "open" operational state. The closed operational state will enable current flow between the capacitors 16 and the source/drain regions 22. In the shown embodiment, the "closing" of such switches corresponds to providing appropriate voltages to the gates 49 to enable current flow across the channel regions 56 between the source/drain regions 52 and 54. The memory cells 12 may be subjected to read/write operations, refresh operations, etc., while the switches are closed. The open operational state of the switches will preclude current flow between the capacitors 16 and the source/drain regions 22, and may be utilized to prevent undesired leakage (and associated data loss) from the capacitors 16 of memory cells 12 while the memory cells are in a resting mode (i.e., are in a non-accessed mode). In the shown embodiment, the "opening" of the switches corresponds to having insufficient voltage along the gates 49 to enable coupling of the source/drain regions 52 and 54 across the channel regions 56.

In some embodiments, the protective transistors 40 may be utilized to alleviate, or even prevent, data loss from memory cells adjacent "hammered" rows; such as, for example, to avoid data loss from the memory cell 12b along the wordline WL1 in applications in which the adjacent wordline WL0 is a "hammered" wordline.

In the shown embodiment, each of the protective transistors 40 has a gate 49 which is electrically coupled with a gate 20 of an access transistor 18 within the same memory cell 12 as the protective transistor 40. For instance, the gate 20a of the access transistor within the memory cell 12a may be referred to as a first gate, and in the embodiment of FIG. 6 is electrically coupled with a second gate corresponding to the gate 49a of the protective transistor 40a within the memory cell 12a.

In some embodiments, the first and second access transistors 18a and 18b may be considered to comprise first and second gates 20a and 20b, respectively; and the protective transistors 40a and 40b may be considered to comprise third and fourth gates 49a and 49b, respectively. In the embodiment of FIG. 6, the third gate 49a is electrically coupled with the first gate 20a, and the fourth gate 49b is electrically coupled with the second gate 20b.

The various components of FIG. 6 may have any suitable architectural relationships relative to one another. For instance, the embodiment of FIG. 6 shows the third and fourth gates 49a and 49b over the first and second gates 20a and 20b; and shows the digit line DL0 between the elevation of the third and fourth gates, and the elevation of the first and second gates. In other embodiments, the digit line may be placed in any other suitable location. Also, the various gates 20a, 20b, 49a, 49b, etc., may be placed in any suitable orientation relative to one another.

Figure 7:
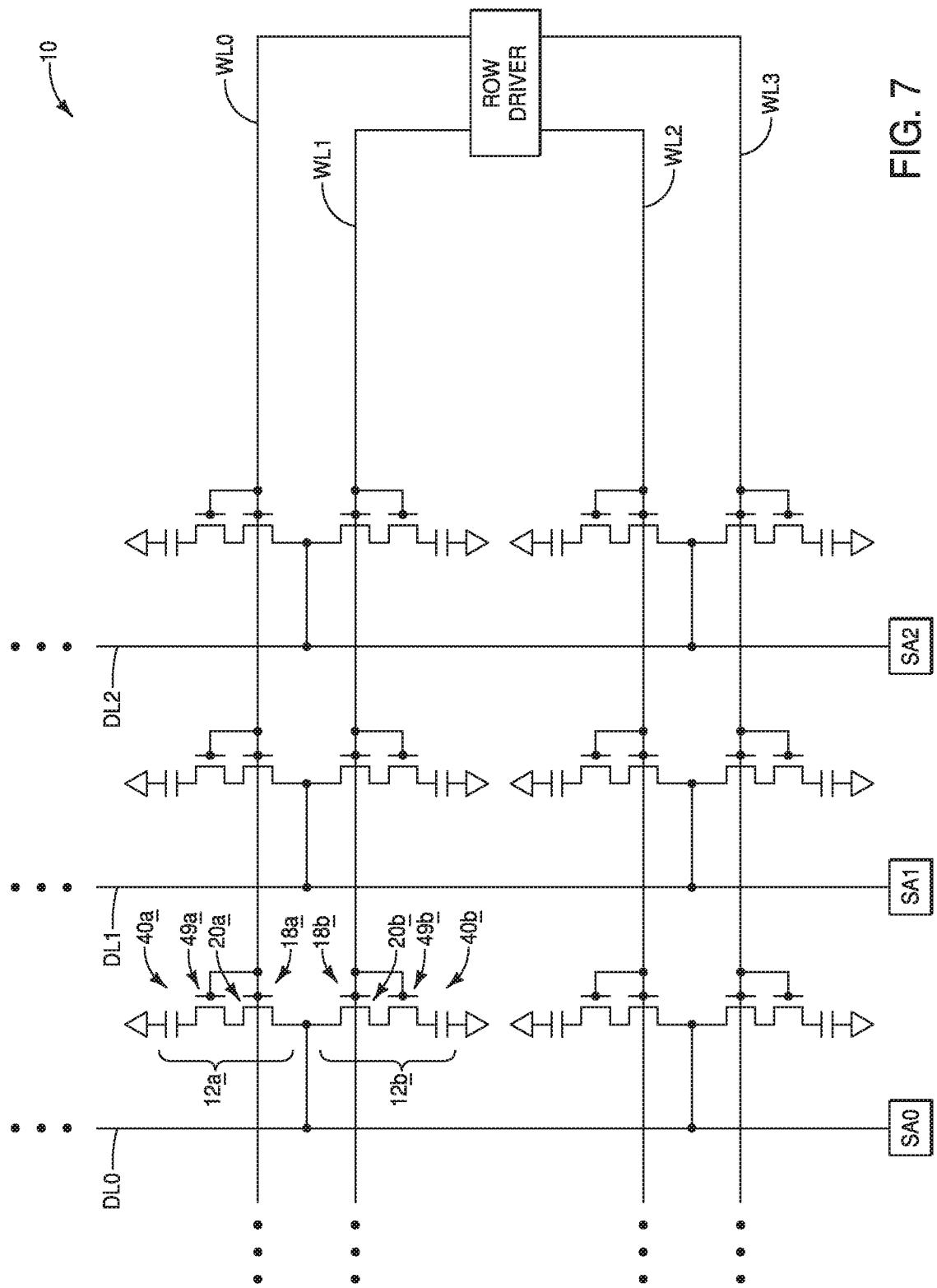
FIG. 7 is a schematic diagram illustrating a region of an example memory array which may comprise the assembly of FIG. 6.

FIG. 7 schematically illustrates the memory array 10 of FIG. 6. The schematic illustration of FIG. 7 shows the protective transistor 40a having a gate 49a coupled with the same wordline (WL0) as the gate 20a of the access transistor 18a; and shows the protective transistor 40b having a gate 49b coupled with the same wordline (WL1) as the gate 20b of the access transistor 18b.

Figure 8:
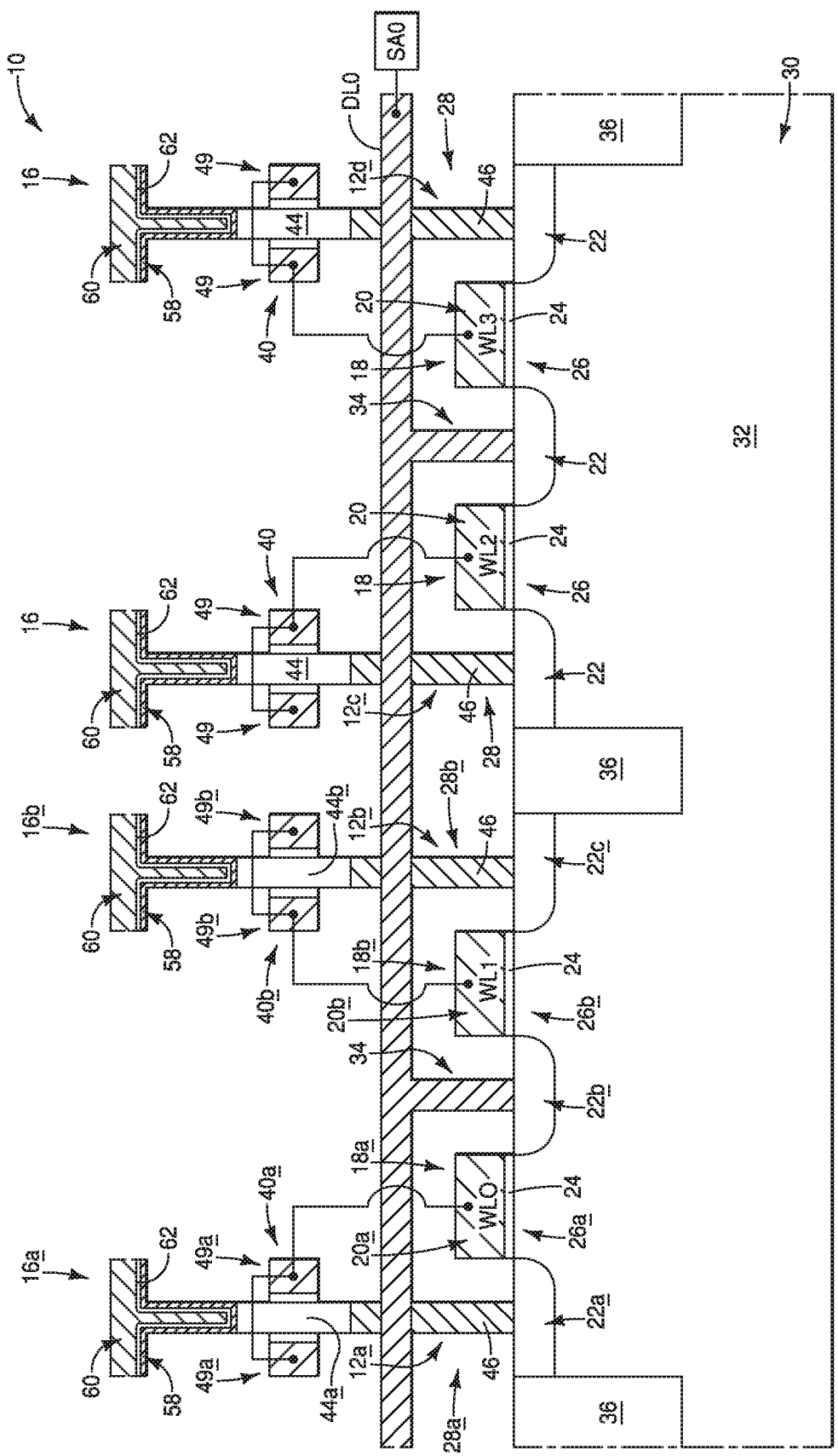
FIG. 8 is a diagrammatic cross-sectional side view showing a region of an example integrated assembly which may be within the memory array of FIG. 7, and which may be a specific example of the more generic assembly of FIG. 6.

The capacitors 16 of FIG. 6 may have any suitable configuration. FIG. 8 shows a region of the memory array 10 analogous to that of FIG. 6, but illustrating a specific example configuration of the capacitors 16. Each of the capacitors 16 comprises a first conductive node 58, a second conductive node 60, and an insulative material 62 between the first and second conductive nodes. The first and second conductive nodes 60 and 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another. The insulative material 62 may comprise any suitable composition(s), and in some embodiments may comprise, consist essentially of, or consist of silicon dioxide.

In the shown embodiment, the lower conductive nodes 58 are configured as upwardly-opening containers. In other embodiments, the lower conductive nodes may have other suitable shapes. The lower conductive nodes 58 may be referred to as storage nodes, and the upper nodes 60 may be referred to as plate electrodes. In some embodiments, the plate electrodes within memory array 10 may all be coupled to one another, and may be coupled to a reference voltage (e.g., the common plate voltage).

In some embodiments, the gates 49 of the protective transistors 40 may not be coupled with the gates 20 of the access transistors 18, but may instead be coupled with multiplexer (mux) circuitry so that the protective transistors may be separately controlled relative to the access transistors. For instance, FIG. 9 shows a region of the memory array 10 analogous to that of FIG. 6, but in which the gates of the protective transistors 40 are coupled with mux lines (mux0, mux1, mux2 and mux3) which extend to a mux driver.

Figure 9:
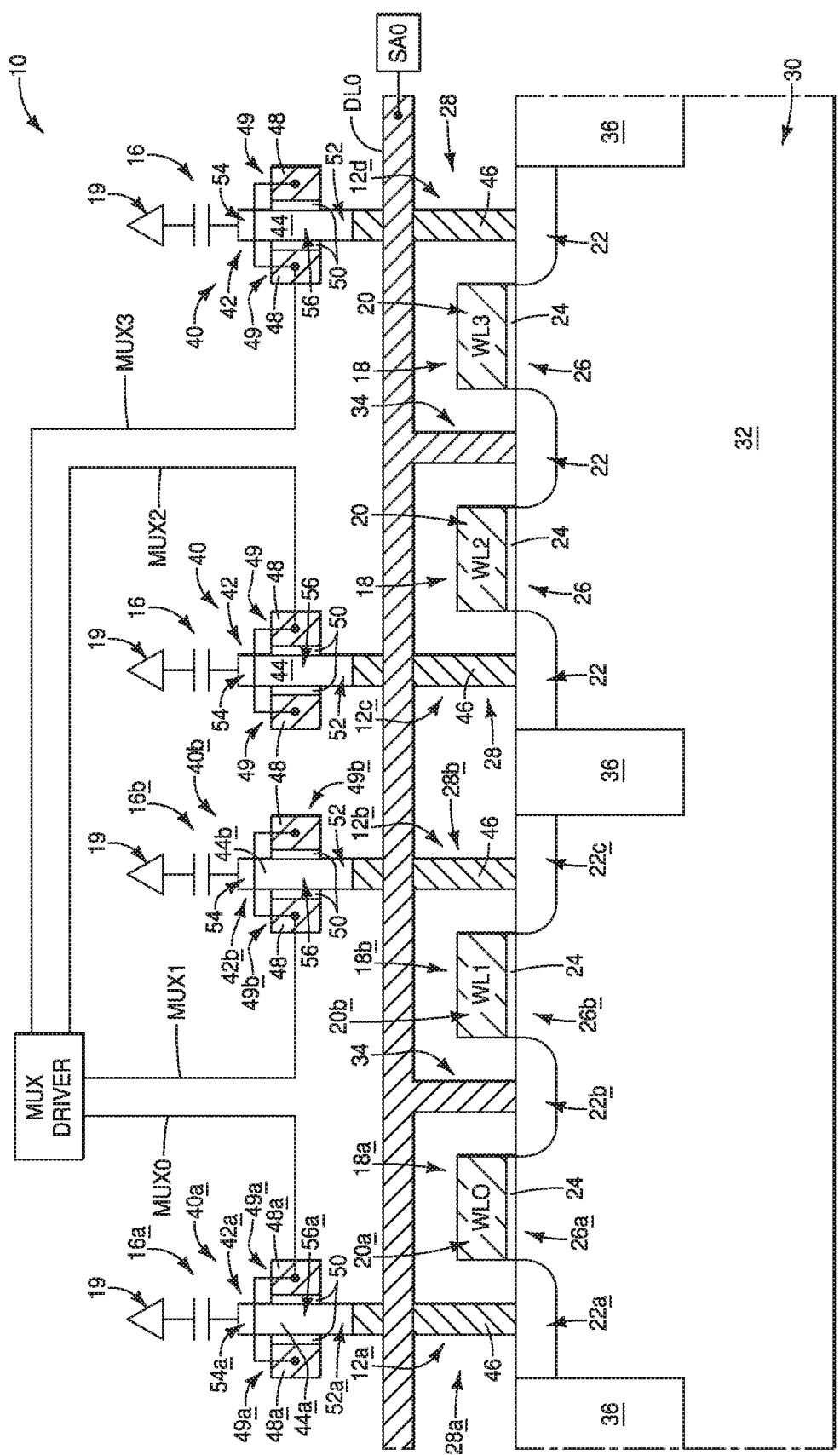
FIG. 9 is a diagrammatic cross-sectional side view showing a region of an example integrated assembly.
Figure 10:
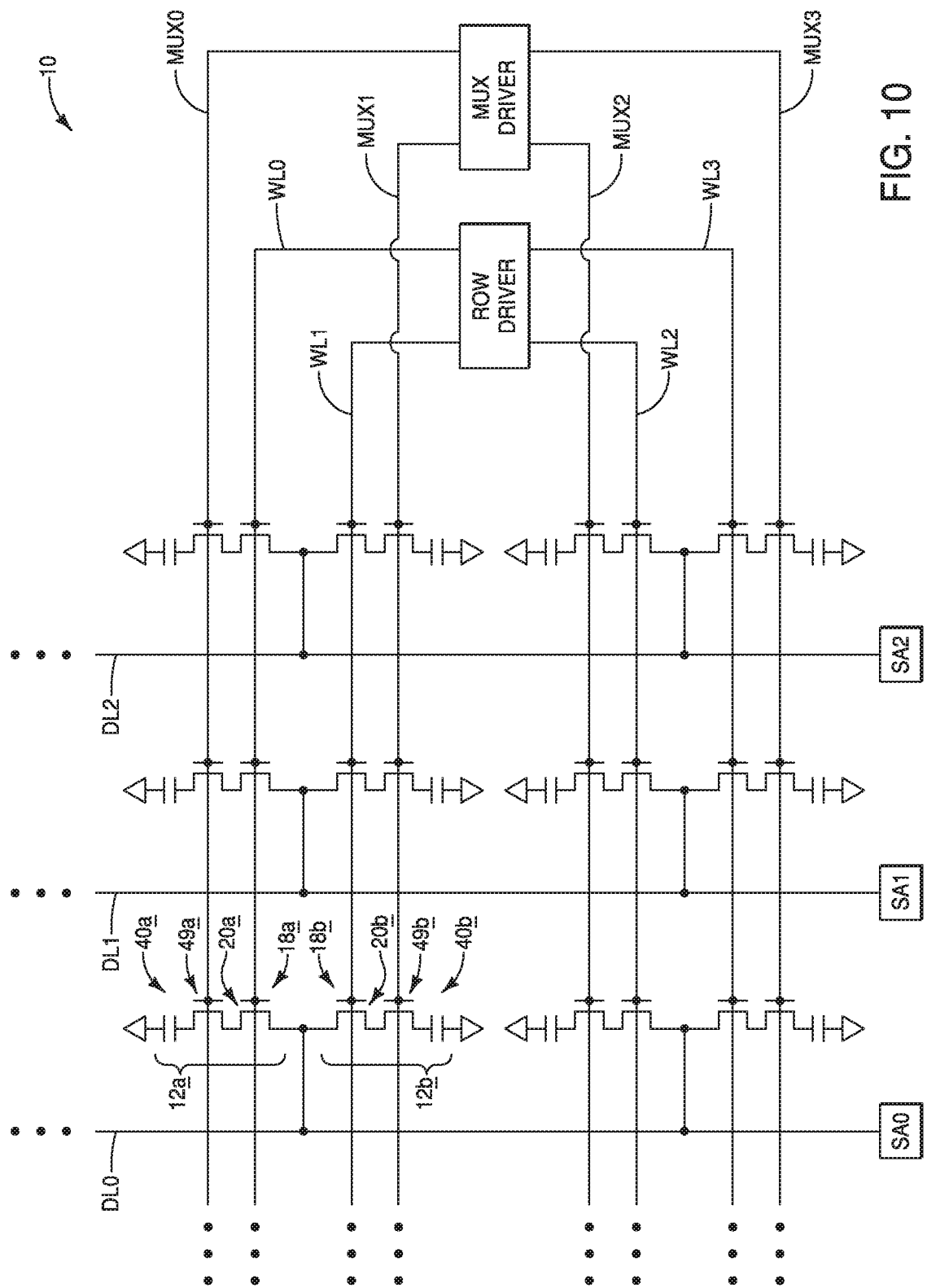
FIG. 10 is a schematic diagram illustrating a region of an example memory array which may comprise the assembly of FIG. 9.

FIG. 10 shows a schematic illustration of the memory array 10 of FIG. 9, and shows that the mux wiring is coupled with the mux driver, while the wordlines are coupled with the row driver. The utilization of a mux driver to control the protective transistors 40 may enable improved operational control of the protective transistors for some applications. However, the utilization of the mux driver may increase the complexity of fabrication as compared to architectures lacking the mux driver (e.g., the architecture of FIG. 7). Accordingly, the architecture of FIG. 7 may be preferred in some applications, and the architecture of FIG. 10 may be preferred in other applications.

Figure 11:
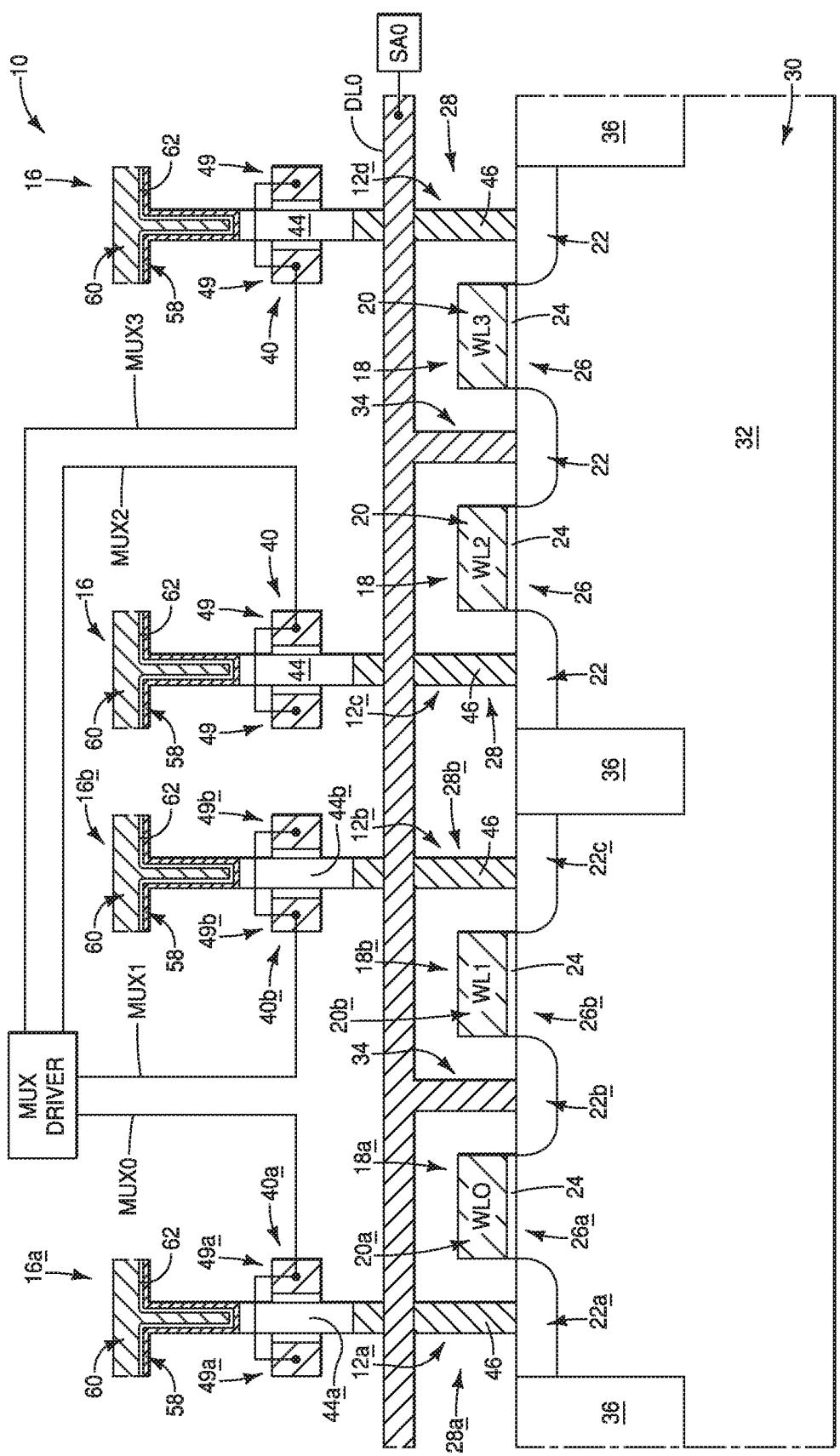
FIG. 11 is a diagrammatic cross-sectional side view showing a region of an example integrated assembly which may be within the memory array of FIG. 10, and which may be a specific example of the more generic assembly of FIG. 9.

The capacitors 16 of FIG. 9 may have any suitable configuration. FIG. 11 shows a region of the memory array 10 analogous to that of FIG. 9, but illustrating a specific example configuration of the capacitors 16. In the shown embodiment of FIG. 11, the capacitors 16 have an identical configuration as that described above with reference to FIG. 8.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having an access transistor. The access transistor has a first source/drain region gatedly coupled with a second source/drain region. A digit line is coupled with the first source/ drain region. A charge-storage device is coupled with the second source/drain region through an interconnect. The interconnect includes a length of a semiconductor material. A protective transistor gates a portion of the length of the semiconductor material.

Some embodiments include an integrated assembly which comprises a first access transistor and a second access transistor. The first access transistor comprises a first gate proximate a first channel region, and the second access transistor comprises a second gate proximate a second channel region. The first and second access transistors together comprise three source/drain regions, with one of the three source/drain regions being shared by the first and second access transistors. The three source/drain regions are a first source/drain region, a second source/drain region and a third source/drain region. The first and second source/drain regions are gatedly coupled to one another through the first channel region. The second and third source/drain regions are gatedly coupled to one another through the second channel region. A digit line is coupled with the second source/drain region. A first charge-storage device is coupled with the first source/drain region through a first interconnect. A second charge-storage device is coupled with the third source/drain region through a second interconnect. A first switch controls current flow along the first interconnect. A second switch controls current flow along the second interconnect.

Some embodiments include an integrated assembly which comprises a first access transistor and a second access transistor. The first access transistor comprises a first gate proximate a first channel region, and the second access transistor comprises a second gate proximate a second channel region. The first and second access transistors together comprises three source/drain regions, with one of the three source/drain regions being shared by the first and second access transistors. The three source/drain regions are a first source/drain region, a second source/drain region and a third source/drain region. The first and second source/drain regions are gatedly coupled to one another through the first channel region. The second and third source/drain regions are gatedly coupled to one another through the second channel region. The first channel region extends horizontally between the first and second source/drain regions. The second channel region extends horizontally between the second and third source/drain regions. A digit line is coupled with the second source/drain region. A first capacitor is coupled with the first source/drain region through a first interconnect. The first interconnect comprises a first vertically-extending pillar of a first semiconductor material. A second capacitor is coupled with the third source/drain region through a second interconnect. The second interconnect comprises a second vertically-extending pillar of a second semiconductor material. A first protective transistor gates a portion of the first vertically-extending pillar of the first semiconductor material. A second protective transistor gates a portion of the second vertically-extending pillar of the second semiconductor material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
an access transistor having a first source/drain region and a second source/drain region which are gatedly coupled to one another by a first gate of the access transistor;
a digit line coupled with the first source/drain region;
a charge-storage device coupled with the second source/drain region through an interconnect, the interconnect comprising a length of a semiconductor material; and
a protective transistor comprising a second gate that gates a portion of the length of the semiconductor material, the second gate is directly electrically coupled with the first gate of the access transistor.

2. The integrated assembly of claim 1 wherein the length of the semiconductor material is a vertically-extending pillar of the semiconductor material.

3. The integrated assembly of claim 1 wherein:
the access transistor comprises a horizontally-extending channel region between the first and second source/drain regions;
the protective transistor comprises third and fourth source/drain regions within the length of the semiconductor material; and
the protective transistor comprises a vertically-extending channel region between the third and fourth source/drain regions.

4. The integrated assembly of claim 1 wherein the charge-storage device is a capacitor.

5. The integrated assembly of claim 1 wherein the digit line is elevationally below the protective transistor.

6. The integrated assembly of claim 3 wherein one of the third and fourth source/drain regions is elevationally above the first gate.

7. The integrated assembly of claim 1 wherein one of the first and second source/drain regions is elevationally below the first gate.

8. The integrated assembly of claim 1 wherein the interconnect comprises a first and a second discrete structure, the first discrete structure comprises the semiconductor material and the second discrete structure comprises a metal.

9. The integrated assembly of claim 8 wherein the first discrete structure is elevationally above the second discrete structure.

10. An integrated assembly, comprising:
a first access transistor and a second access transistor, the first access transistor comprising a first gate proximate a first channel region, and the second access transistor comprising a second gate proximate a second channel region, the first and second access transistors together comprising three source/drain regions, with one of the three source/drain regions being shared by the first and second access transistors, the three source/drain regions being a first source/drain region, a second source/drain region and a third source/drain region, with the first and second source/drain regions being gatedly coupled to one another through the first channel region, and with the second and third source/drain regions being gatedly coupled to one another through the second channel region;
a digit line coupled with the second source/drain region;
a first charge-storage device coupled with the first source/drain region through a first interconnect;
a second charge-storage device coupled with the third source/drain region through a second interconnect;
a first switch controlling current flow along the first interconnect, the first switch comprising a first protective transistor that comprises a third gate, the third gate is directly electrically coupled with the first gate of the first access transistor; and
a second switch controlling current flow along the second interconnect.

11. The integrated assembly of claim 10 wherein the first interconnect comprises a first length of a first semiconductor material, and wherein the second interconnect comprises a second length of a second semiconductor material.

12. The integrated assembly of claim 11 wherein the first switch controls current flow along the first length of the first semiconductor material, and wherein the second switch controls current flow along the second length of the second semiconductor material.

13. The integrated assembly of claim 12 wherein the second switch is a second protective transistor.

14. The integrated assembly of claim 13 wherein:
the second protective transistor comprises a fourth gate which is electrically coupled with the multiplexer circuitry.

15. The integrated assembly of claim 10 wherein the first and second charge-storage devices are first and second capacitors, respectively.

16. The integrated assembly of claim 10 wherein the digit line is elevationally below the first and second switches.

17. The integrated assembly of claim 10 wherein the first interconnect comprises a first and a second discrete structure, the first discrete structure comprises a metal.

18. The integrated assembly of claim 17 wherein the first discrete structure is elevationally below the second discrete structure.

19. The integrated assembly of claim 17 wherein the first discrete structure comprising the metal contacts the first source/drain region.

20. The integrated assembly of claim 17 wherein the metal comprises one or more of titanium, tungsten, cobalt, nickel, platinum, ruthenium, and/or metal silicide, metal nitride and metal carbide.

21. An integrated assembly, comprising:
a first access transistor and a second access transistor, the first access transistor comprising a first gate proximate a first channel region, and the second access transistor comprising a second gate proximate a second channel region, the first and second access transistors together comprising three source/drain regions, with one of the three source/drain regions being shared by the first and second access transistors, the three source/drain regions being a first source/drain region, a second source/drain region and a third source/drain region, with the first and second source/drain regions being gatedly coupled to one another through the first channel region, and with the second and third source/drain regions being gatedly coupled to one another through the second channel region, the first channel region extending horizontally between the first and second source/drain regions, the second channel region extending horizontally between the second and third source/drain regions;
a digit line coupled with the second source/drain region;
a first capacitor coupled with the first source/drain region through a first interconnect, the first interconnect comprising a first vertically-extending pillar of a first semiconductor material;
a second capacitor coupled with the third source/drain region through a second interconnect, the second interconnect comprising a second vertically-extending pillar of a second semiconductor material;
a first protective transistor comprising a third gate that gates a portion of the first vertically-extending pillar of the first semiconductor material, the third gate is directly electrically coupled with the first gate of the first access transistor; and
a second protective transistor gating a portion of the second vertically-extending pillar of the second semiconductor material.

22. The integrated assembly of claim 21 wherein the second protective transistor comprises a fourth gate, and wherein the third and fourth gates are over the first and second gates.

23. The integrated assembly of claim 22 wherein the digit line is over the first and second gates and is under the third and fourth gates.

24. The integrated assembly of claim 21 wherein the first interconnect comprises a first and a second discrete structure, the first discrete structure comprises a metal.

25. The integrated assembly of claim 24 wherein the first discrete structure is elevationally below the second discrete structure.

26. The integrated assembly of claim 24 wherein the first discrete structure comprising the metal contacts the first source/drain region.

27. The integrated assembly of claim 24 wherein the metal comprises one or more of titanium, tungsten, cobalt, nickel, platinum, ruthenium, and/or metal silicide, metal nitride and metal carbide.

* * * * *